United States Patent
Kim et al.

(10) Patent No.: US 9,176,383 B2
(45) Date of Patent: Nov. 3, 2015

(54) PHOTORESIST COMPOSITION AND METHOD OF MANUFACTURING THIN FILM TRANSISTOR SUBSTRATE USING THE SAME

(71) Applicant: SAMSUNG DISPLAY CO., LTD., Yongin, Gyeonggi-Do (KR)

(72) Inventors: Jeong-Won Kim, Yongin (KR); Ki-Hyun Cho, Yongin (KR); Kwang-Woo Park, Yongin (KR); Chul-Won Park, Yongin (KR); Jin-Ho Ju, Yongin (KR); Dong-Min Kim, Yongin (KR); Eun Jeagal, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/531,758

(22) Filed: Nov. 3, 2014

(65) Prior Publication Data

US 2015/0126005 A1    May 7, 2015

(30) Foreign Application Priority Data

Nov. 4, 2013 (KR) .................. 10-2013-0132996

(51) Int. Cl.
| | |
|---|---|
| *G03F 7/075* | (2006.01) |
| *G03F 7/039* | (2006.01) |
| *G03F 7/022* | (2006.01) |
| *G03F 7/30* | (2006.01) |
| *G03F 7/36* | (2006.01) |
| *G03F 7/42* | (2006.01) |
| *H01L 21/027* | (2006.01) |
| *H01L 27/12* | (2006.01) |
| *H01L 21/3213* | (2006.01) |

(52) U.S. Cl.
CPC .............. *G03F 7/0752* (2013.01); *G03F 7/022* (2013.01); *G03F 7/039* (2013.01); *G03F 7/0757* (2013.01); *G03F 7/30* (2013.01); *G03F 7/36* (2013.01); *G03F 7/42* (2013.01); *H01L 21/0271* (2013.01); *H01L 21/32133* (2013.01); *H01L 21/32139* (2013.01); *H01L 27/1288* (2013.01)

(58) Field of Classification Search
None
See application file for complete search history.

(56) References Cited

U.S. PATENT DOCUMENTS

| | | | |
|---|---|---|---|
| 6,537,719 | B1 | 3/2003 | Takahashi |
| 7,591,270 | B2 | 9/2009 | Zhang et al. |
| 8,067,625 | B2 | 11/2011 | Hierse et al. |
| 8,703,385 | B2 * | 4/2014 | Qiu et al. .................. 430/270.1 |
| 2007/0026509 | A1 | 2/2007 | Rogers et al. |
| 2008/0048350 | A1 * | 2/2008 | Chen et al. .................... 264/2.6 |

FOREIGN PATENT DOCUMENTS

| | | |
|---|---|---|
| EP | 1170632 A | 1/2002 |
| KR | 2001-0042367 A | 5/2001 |
| KR | 10-2006-0021878 A | 3/2006 |
| KR | 10-0754232 B | 8/2007 |
| KR | 10-1034347 B | 12/2008 |

* cited by examiner

*Primary Examiner* — Sin Lee
(74) *Attorney, Agent, or Firm* — Lee & Morse, P.C.

(57) ABSTRACT

A photoresist composition may include a novolac resin, a diazide-based photosensitive compound, a surfactant represented by Chemical Formula 1 below, and a solvent.

[Chemical Formula 1]

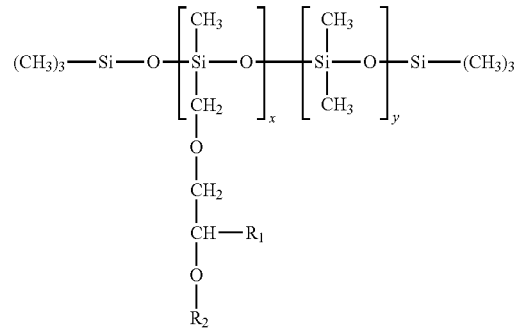

R1 and R2 may denote a hydrogen atom or an alkyl group, x may be 10-50, and y may be 10-50.

20 Claims, 6 Drawing Sheets

Example 1

Comparative Example 1

Comparative Example 2

PHOTORESIST COMPOSITION AND METHOD OF MANUFACTURING THIN FILM TRANSISTOR SUBSTRATE USING THE SAME

CROSS-REFERENCE TO RELATED APPLICATION

Korean Patent Application No. 10-2013-0132996, filed on Nov. 4, 2013, in the Korean Intellectual Property Office, and entitled: "Photoresist Composition And Method Of Manufacturing Thin Film Transistor Substrate Using The Same," is incorporated by reference herein in its entirety.

BACKGROUND

1. Field

Embodiments relate to a photoresist composition and a method of manufacturing a thin film transistor (TFT) substrate using the same.

2. Description of the Related Art

In order to form a microcircuit pattern, such as a display apparatus circuit or a semiconductor integrated circuit (IC), a photoresist composition may be uniformly coated or deposited on a conductive metal layer or an insulating layer on a substrate. Thereafter, in the presence of a mask with a predetermined shape, the coated photoresist composition may be exposed and developed to form a pattern with a desired shape. Thereafter, by using the mask, the conductive metal layer or the insulating layer may be etched, and a residual photoresist layer may be removed to form a microcircuit on the substrate.

SUMMARY

Embodiments are directed to a photoresist composition including a solvent, a novolac resin, a diazide-based photosensitive compound, and a surfactant represented by Chemical Formula 1:

[Chemical Formula 1]

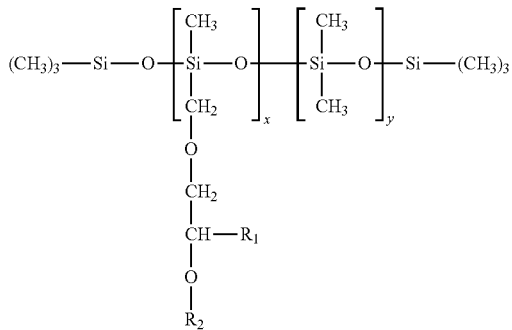

In Chemical Formula 1, $R_1$ and $R_2$ may denote a hydrogen atom or an alkyl group, x may be 10-50, and y may be 10-50.

The photoresist composition may include about 5 wt % to about 30 wt % of the novolac resin, about 2 wt % to about 10 wt % of the diazide-based photosensitive compound, about 0.001 wt % to about 0.1 wt % of the surfactant, and a residual amount of the solvent.

The novolac resin may include meta-cresol and para-cresol. A weight ratio of the meta-cresol to the para-cresol may be about 4:6 to about 8:2, and a weight average molecular weight of the novolac resin may be about 3,000 g/mol to about 20,000 g/mol.

The diazide-based photosensitive compound may include at least one of 2,3,4-trihydroxybenzophenone-1,2-naphthoquinonediazide-5-sulfonate and 2,3,4,4'-tetrahydroxybenzophenone-1,2-naphthoquinonediazide-5-sulfonate.

The solvent may include at least one solvent selected from propyleneglycolmethyletheracetate, ethyl lactate, 2-methoxyethylacetate, propyleneglycolmonomethylether, methylethylketone, methylisobutylketone, and 1-methyl-2-pyrrolidinone.

The surfactant may be hydrophilic.

The photoresist composition may be a positive photoresist composition.

The photoresist composition may further include at least one additive selected from a coloring agent, a dye, a plasticizer, an adhesion accelerator, a speed enhancer, and a striation inhibitor.

Example embodiments provide a method of manufacturing a thin film transistor (TFT) substrate including forming a conductive layer of conductive material on a substrate, forming an etching pattern of a photoresist composition on the conductive layer, and forming a conductive layer pattern by etching the conductive layer using the etching pattern as an etching mask.

The conductive layer pattern may be a pixel electrode pattern including a transparent conductive material.

The pixel electrode pattern may include a plurality of microelectrodes and a plurality of microslits between the plurality of microelectrodes.

The conductive layer pattern may be a gate line or a data line.

The etching pattern may be removed with a stripper.

BRIEF DESCRIPTION OF THE DRAWINGS

Features will become apparent to those of skill in the art by describing in detail example embodiments with reference to the attached drawings in which.

DETAILED DESCRIPTION

Figure 1:
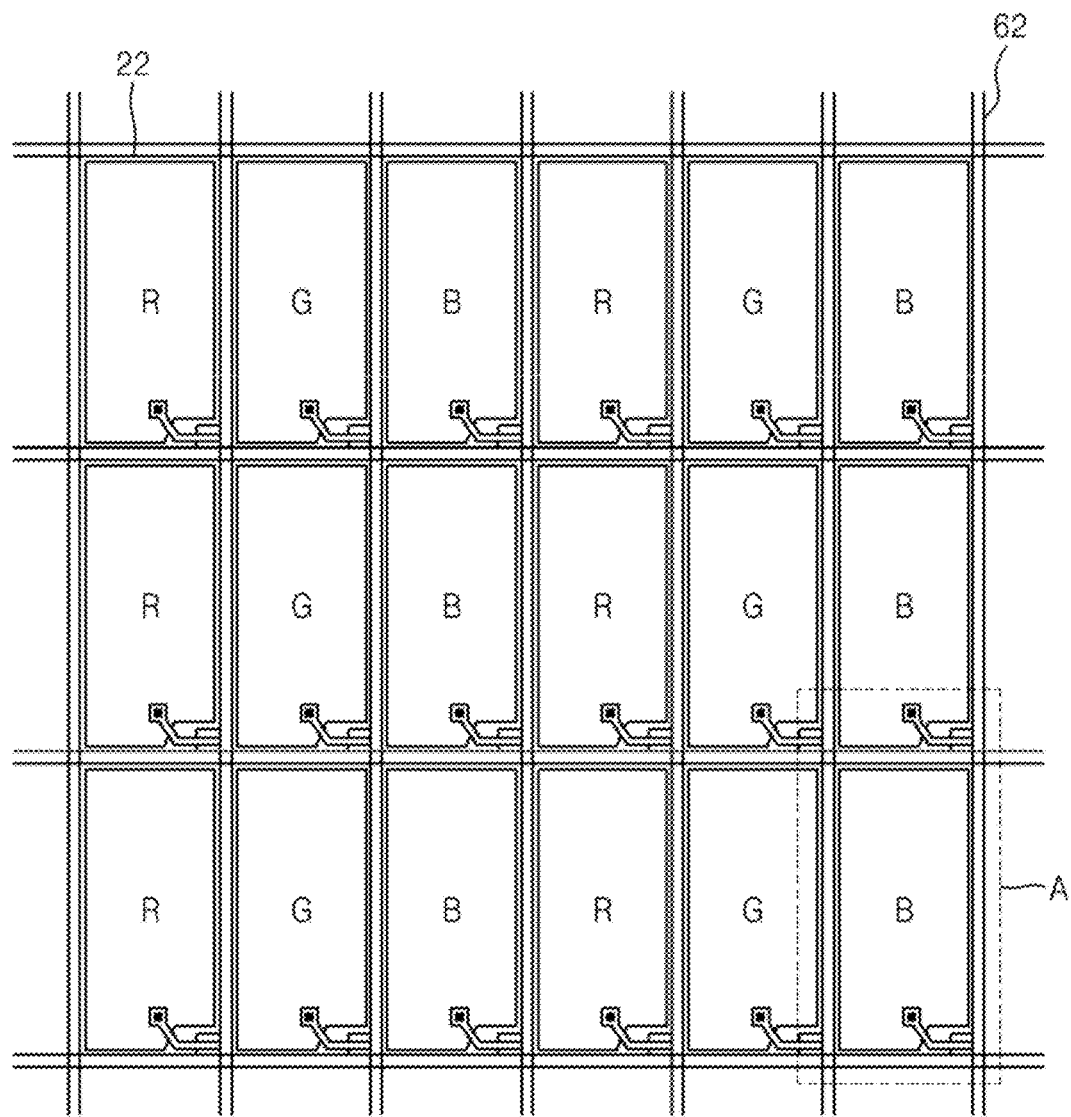
FIG. 1 illustrates a layout view of a thin film transistor (TFT) substrate manufactured by a method according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

It will be further understood that the terms "comprise," "include," and "have" used herein specify the presence of stated features or components, but do not preclude the presence or addition of one or more other features or components.

It will be understood that when a layer, region, or component is referred to as being "on" or "formed on" another layer, region, or component, it may be directly or indirectly formed on the other layer, region, or component. That is, for example, intervening layers, regions, or components may be present.

Figure 2:
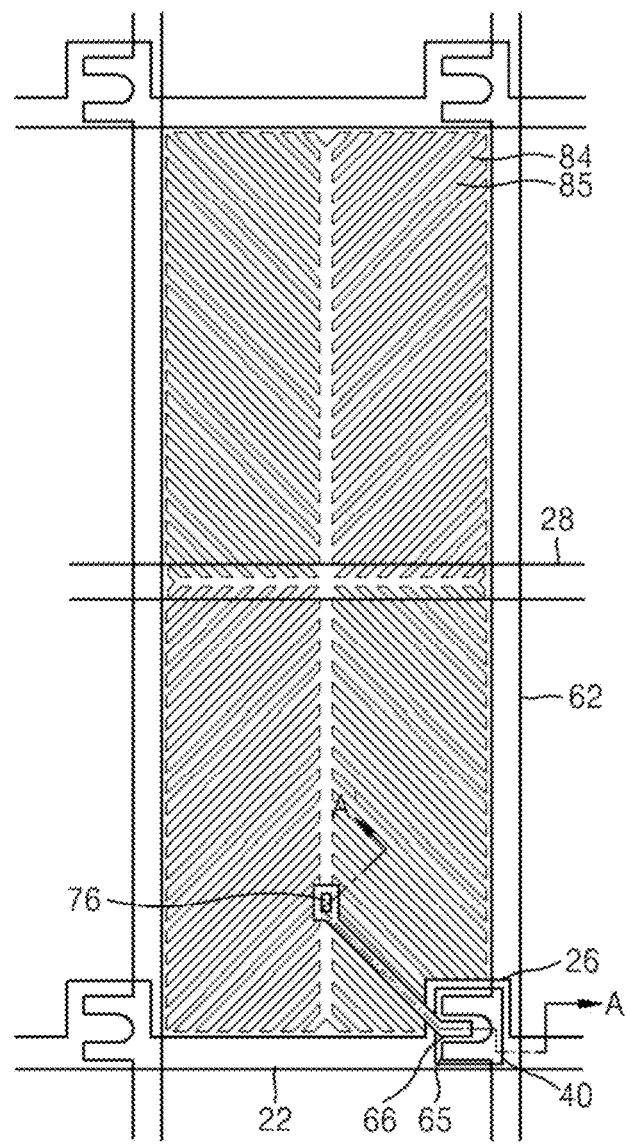
FIG. 2 illustrates an enlarged view of a portion A of FIG. 1.
Figure 3:
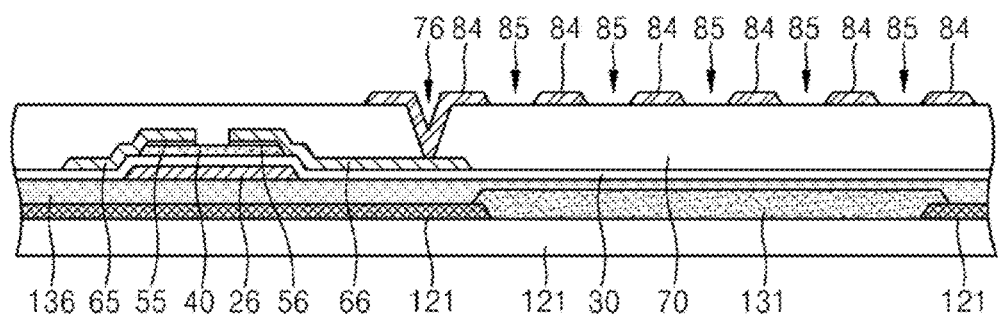
FIG. 3 illustrates a cross-sectional view taken along line A-A' of FIG. 2.

FIG. 1 illustrates a layout view of a thin film transistor (TFT) substrate manufactured by a method according to an example embodiment. FIG. 2 illustrates an enlarged view of a portion A of FIG. 1. FIG. 3 illustrates a cross-sectional view taken along line A-A' of FIG. 2.

Referring to FIGS. 1 to 3, a TFT substrate manufactured by a method according to an example embodiment may include a plurality of pixels arranged in a matrix configuration, and a plurality of TFTs provided in the respective pixels. A plurality of gate lines 22 extending along the boundaries of the pixels may be arranged in a row direction of the pixels, and a plurality of data lines 62 extending along the boundaries of the pixels may be arranged in a column direction of the pixels. A TFT including a gate electrode 26, a source electrode 65, and a drain electrode 66 may be formed at an intersection between the gate line 22 and the data line 62.

The TFT substrate may have an array-on-color filter (AOC) structure, in which a color filter 131 is formed on an insulating substrate 10 and a TFT array including gate lines is formed on the color filter 131. In an implementation, the TFT substrate may have, e.g., a color filter-on-array (COA) structure, in which a color filter 131 is formed on a TFT array, etc. Hereinafter, an AOC type TFT substrate will be described as an example.

In the AOC type TFT substrate, black matrixes 121 may be formed directly on an insulating substrate 10. Red (R), green (G) and blue (B) color filters 131 may be sequentially arranged in pixel regions between the black matrixes 121. An overcoat layer 136 may be formed on the color filters 131 to planarize step portions of the color filters 131.

A gate line 22 including a gate electrode 26 and a storage line 28, and a data line 62 including a gate insulating layer 30, an active layer 40, ohmic contact layers 55 and 56, a source electrode 65, and a drain electrode 66 may be formed on the overcoat layer 136. A passivation layer 70 having a contact hole 76 may be formed on the data line 62, and a pixel electrode pattern 84/85 may be disposed on the passivation layer 70.

The pixel electrode pattern 84/85 may be formed of transparent conductive material, such as indium tin oxide (ITO) or indium zinc oxide (IZO). The pixel electrode pattern 84/85 of the present example embodiment may include a plurality of microelectrodes 84 and a plurality of microslits 85 formed between the plurality of microelectrodes 84. In detail, for example, the pixel electrode pattern 84/85 may include a cross-shaped main frame quartering the pixel region, a plurality of microelectrodes 84 formed obliquely from the main frame toward the outline of the pixel region, and a plurality of microslits 85 disposed between the plurality of microelectrodes 84. The plurality of microelectrodes 84 formed in the oblique direction may be formed in four different directions from the center of the pixel region. Accordingly, when a driving power voltage is applied to a liquid crystal display apparatus, liquid crystals (not illustrated) may be aligned in four different directions.

The width of the microelectrode 84 may be equal or different at a center portion of the pixel electrode pattern 84/85, that is, a point at which the microelectrode 84 contacts the main frame, and an outline portion of the pixel region. Although not illustrated, a common electrode substrate disposed on the TFT substrate of the present example embodiment may include a common electrode that is not patterned.

FIGS. 4 to 11 illustrate cross-sectional views illustrating a method of manufacturing a TFT substrate according to an example embodiment.

Figure 4:
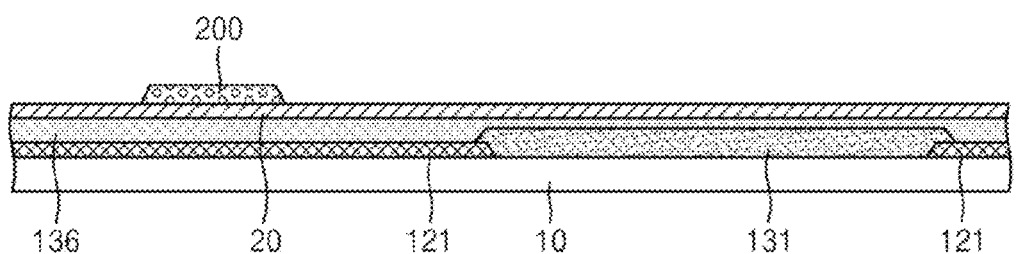
FIGS. 4 to 11 illustrate schematic cross-sectional views illustrating a method of manufacturing a TFT substrate according to an example embodiment.

Referring to FIG. 4, an insulating substrate 10 may be provided in order to manufacture a TFT substrate.

For example, the insulating substrate 10 may be formed of glass material such as soda lime glass or borosilicate glass, or plastic material such as polyether sulfone or polycarbonate. Also, the insulating substrate 10 may be a flexible substrate formed of, for example, polyimide.

The insulating substrate 10 may have a size corresponding to a unit TFT substrate used in a liquid crystal display apparatus, or may be a large-sized substrate for manufacture of a plurality of TFT substrates.

An opaque material, such as chromium (Cr) or chromium oxide ($CrO_x$), may be deposited on the insulating substrate 10 and patterned to form black matrixes 121.

A photoresist, for example, may be deposited on the black matrixes 121 and the insulating substrate 10 exposed by the black matrixes 121. The photoresist may be exposed and developed to form R, G and B color filters 131.

An overcoat layer 136 may be formed on the black matrixes 121 and the color filters 131.

Referring to FIG. 4, a gate line conductive layer 20 may be deposited on the overcoat layer 136, and a gate electrode 26 may be formed. A photoresist pattern 200 used to form the gate electrode 26 may be formed using a positive photoresist composition according to an example embodiment. The positive photoresist composition will be described below. In order to form the gate electrode 26, the gate line conductive layer 20 may be formed by, for example, sputtering. The sputtering may be performed at a low temperature of 200° C. or less.

The photoresist pattern 200 may be formed on the gate line conductor layer 20, and the gate line conductive layer 20 may be patterned by wet etching or dry etching by using the photoresist pattern 200 as an etching mask. The wet etching may include wet etching with an etchant such as phosphoric acid, nitric acid, or acetic acid.

The gate electrode 26 may be formed of an aluminum-based metal, such as aluminum (Al) or an Al alloy, a silver-based metal, such as silver (Ag) or a Ag alloy, a copper-based metal, such as copper (Cu) or a Cu alloy, a molybdenum-based metal, such as molybdenum (Mo) or a Mo alloy, chromium (Cr), titanium (Ti), or tantalum (Ta). The gate electrode 26 may have a multilayer structure including two conductive layers (not illustrated) having different physical characteristics. In order to reduce a voltage drop or a signal delay of the gate electrode 26, one of the conductive layers may be formed of low-resistivity metal such as an aluminum-based metal, a silver-based metal, or a copper-based metal. The other conductive layer may be formed of material having excellent contact characteristics with respect to zinc oxide (ZnO), ITO, and IZO, for example, a molybdenum-based metal, chromium, titanium, or tantalum. An example combination may be a chromium lower layer, an aluminum upper layer, an aluminum lower layer, and a molybdenum upper layer. In other embodiments, the gate electrode 26 may be formed of various metals and conductive materials.

Figure 5:
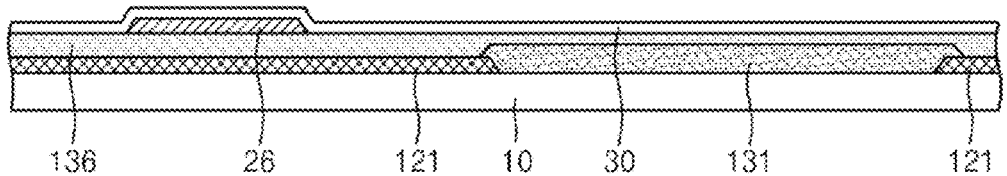

Referring to FIG. 5, a gate insulating layer 30 of silicon nitride ($SiN_x$) or silicon oxide may be formed on the insulating substrate 10 and the gate electrode 26 by, e.g., chemical vapor deposition (CVD) or sputtering.

Figure 6:
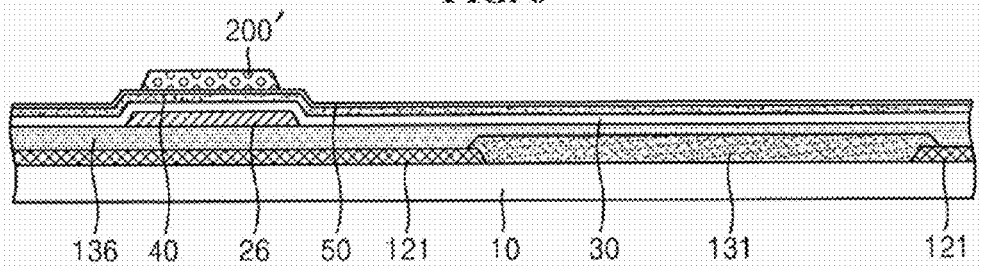

Thereafter, referring to FIG. 6, amorphous silicon hydride or polysilicon may be deposited on the gate insulating layer 30 by, for example, CVD or sputtering to form an active layer 40. Thereafter, silicide or $n^+$ amorphous silicon hydride, which may be heavily doped with n-type dopant, may be deposited on the active layer 40 by, for example, CVD or sputtering to form an ohmic layer 50.

A photoresist pattern 200' may be formed on the active layer 40 and the ohmic layer 50. The active layer 40 and the ohmic layer 50 may be patterned by using the photoresist pattern 200' as an etching mask. Accordingly, an active layer pattern 44 and an ohmic layer pattern 54 may be form as shown, for example in FIG. 7. The term "active" in the active layer pattern 44 refers to active material having electrical characteristics when a driving current is applied, and may include semiconductor material and metal oxide.

The active layer pattern 44 and the ohmic layer pattern 54 may be formed by wet etching or dry etching. The wet etching may use an etchant including a mixture of deionized water and hydrofluoric acid, sulfuric acid, hydrochloric acid, or a combination thereof. The dry etching may use fluorine-based etching gas such as $CHF_3$ or $CF_4$. In detail, the dry etching may use argon (Ar) or helium (He)-containing etching gas as the fluorine-based etching gas.

Figure 7:
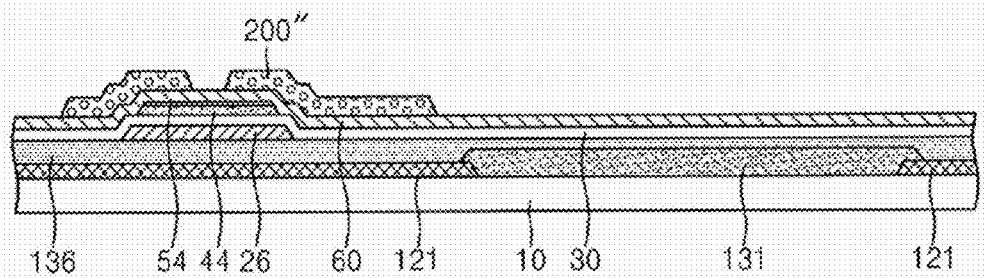
Figure 8:
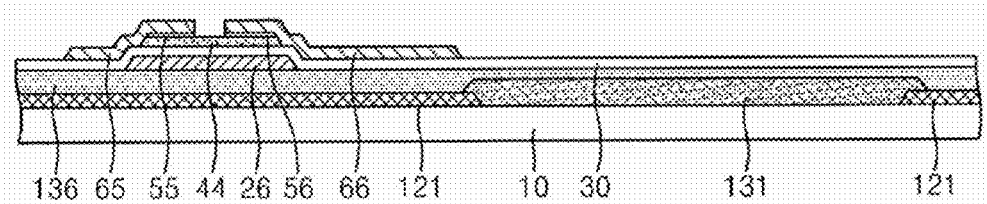

Referring to FIGS. 7 and 8, a data line conductive layer 60 including a single layer or a multiple layer formed of Ni, Co, Ti, Ag, Cu, Mo, Al, Be, Nb, Au, Fe, Se, or Ta may be deposited by, for example, CVD or sputtering.

Examples of the multiple layer may include a double layer such as Ta/Al, Ta/Al, Ni/Al, Co/Al, or Mo (Mo alloy)/Cu, and a triple layer such as Ti/Al/Ti, Ta/Al/Ta, Ti/Al/TiN, Ta/Al/TaN, Ni/Al/Ni, or Co/Al/Co.

Referring to FIG. 6, a photoresist pattern 200" may be formed on the data line conductive layer 60, and a source electrode 65 and a drain electrode 66 may be formed by etching the data line conductive layer 60 while using the photoresist pattern 200" as an etching mask. The data line conductive layer 60 may be etched by wet etching or dry etching. The wet etching may use an etchant, such as a mixture of phosphoric acid, nitric acid, and acetic acid, or a mixture of hydrofluoric acid and deionized water. In this case, the ohmic layer pattern 54 may be etched and removed using the photoresist pattern 20 used to etch the data line conductive layer 60. Accordingly, ohmic contact layers 55 and 56 may be formed to overlap the source electrode 65 and the drain electrode 66.

Figure 9:
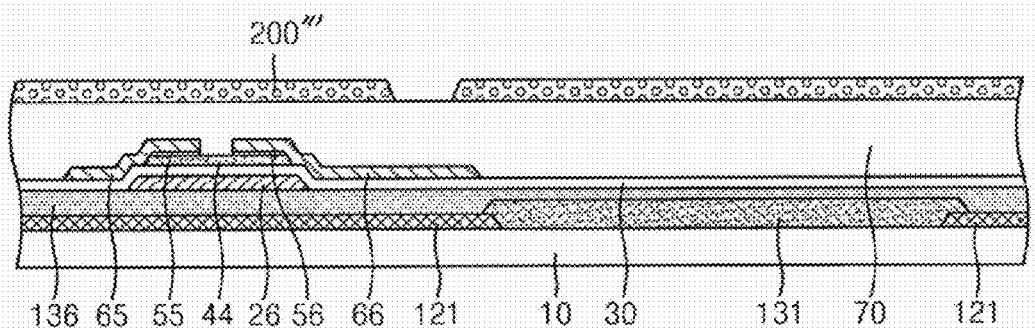

Referring to FIG. 9, a passivation layer 70 may be formed on the active layer pattern 44, the source electrode 65, and the drain electrode 66.

A photoresist pattern 200''' may be formed on the passivation layer 70. By using the photoresist pattern 200''' as an etch mask, a contact hole 76 may be formed to expose the drain electrode 66.

Figure 10:
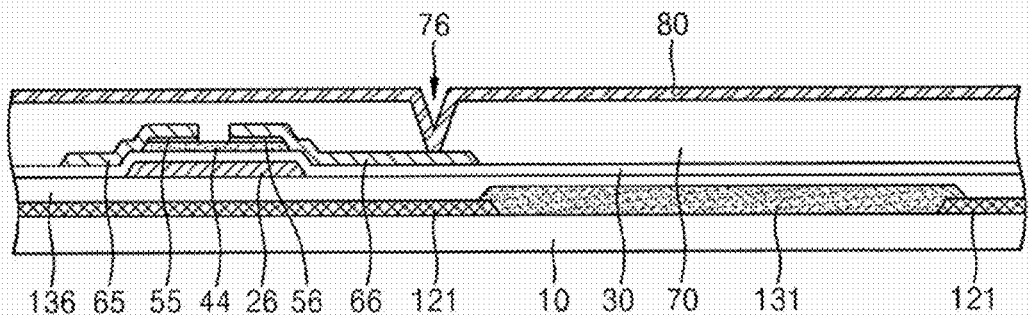

Referring to FIG. 10, a pixel electrode conductive layer 80 may be formed of reflective conductive material or transparent conductive material such as ITO or IZO. The pixel electrode conductive layer 80 may be deposited by, for example, sputtering.

Figure 11:
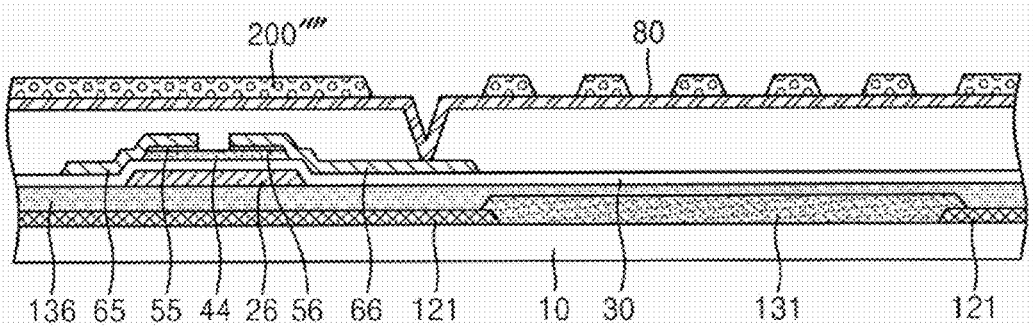

Referring to FIG. 11, a photoresist composition according to an embodiment may be deposited on the pixel electrode conductive layer 80 by spraying, roll coating, or spin coating.

The deposited photoresist composition may be soft-baked at about 105° C. for about 1 minute to about 5 minutes to remove a solvent contained in the photoresist composition. Accordingly, a photoresist layer may be formed. Thereafter, an ultraviolet radiation having a wavelength of about 365 nm to about 435 nm may be irradiated onto the photoresist layer such that the photoresist layer has a predetermined pattern shape. Thereafter, the insulating substrate 10 having the photoresist layer formed thereon may be immersed into a developer to remove a portion onto which the ultraviolet radiation has been irradiated, thereby forming a predetermined photoresist pattern.

The developer may include an alkali solution, for example, a solution of inorganic alkalis such as sodium hydroxide, potassium hydroxide, and sodium carbonate; primary amines such as ethylamine and n-propylamine; secondary amines such as diethylamine and n-propylamine; tertiary amines such as trimethylamine, methyldiethylamine, dimethylethylamine, and triethylamine; alcohol amines such as dimethylethanolamine, methyldiethanolamine, and triethanolamine; or quaternary ammonium salts such as tetramethylammonium hydroxide and tetraethylammonium hydroxide.

Referring to FIG. 11, following a cleaning process, an unnecessary portion of the photoresist layer may be completely removed and it may be dried to form the etching pattern 200'''' for etching the underlying layer 80.

The photoresist composition used to manufacture the TFT substrate of the present example embodiment may include about 5 wt % to about 30 wt % of novolac resin, about 2 wt % to about 10 wt % of diazide-based photosensitive compound, about 0.001 wt % to about 0.1 wt % of surfactant represented by Chemical Formula 1 below, and a residual amount of solvent.

[Chemical Formula 1]

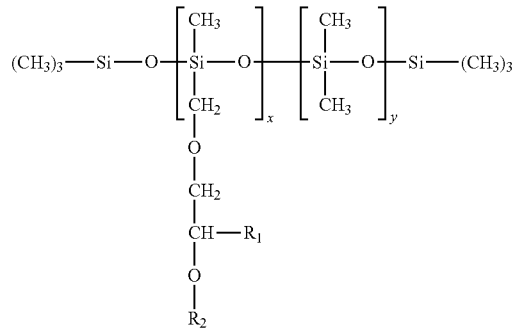

In Chemical Formula 1, $R_1$ and $R_2$ may denote a hydrogen atom or an alkyl group, x may be 10-50, and y may be 10-50.

Referring to FIG. 11, by using the etching pattern 200'''' as an etch mask, the pixel electrode conductive layer 80 may be etched to form a pixel electrode pattern 84/85 (see FIG. 2).

The etching pattern 200'''' may be removed by a stripper. Accordingly, a TFT substrate according to an example embodiment may be completed.

By using the photoresist composition according to an embodiment, the stripper may be used to prevent or substantially prevent the etching pattern 200'''' from being left on the pixel electrode pattern 84/85. Accordingly, the occurrence of a foreign substance defect on the pixel electrode pattern 84/85 may be reduced or prevented.

An example method of manufacturing a TFT substrate of a liquid crystal display apparatus by using the photoresist composition has been described above. In other embodiments, the photoresist composition may also be used in various other display apparatuses such as an organic light-emitting display apparatus, a plasma display apparatus, and a field-effect display apparatus.

Hereinafter, a photoresist composition according to an example embodiment will be described.

The photoresist composition may include about 5 wt % to about 30 wt % of novolac resin, about 2 wt % to about 10 wt % of diazide-based photosensitive compound, about 0.001 wt % to about 0.1 wt % of surfactant represented by Chemical Formula 1 below, and a residual amount of solvent.

[Chemical Formula 1]

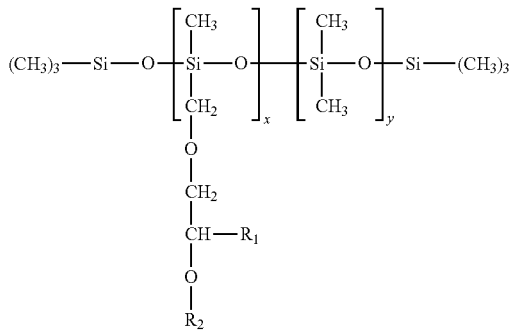

$R_1$ and $R_2$ may denote a hydrogen atom or an alkyl group, x may be 10-50, and y may be 10-50.

The surfactant represented by Chemical Formula 1 may be hydrophilic, and may be present in an amount ranging from about 0.001 wt % to about 0.1 wt % of the entire photoresist composition. When the amount of the surfactant is less than about 0.001 wt %, a coating layer with a uniform thickness may not be formed, or a spot may be easily generated due to a high fluidity in the coating layer. Also, when the amount of the surfactant is greater than about 0.1 wt %, excessive bubbles may be generated in a process of forming the photoresist composition.

The novolac resin may be alkali-soluble, and may be a suitable novolac resin. For example, the novolac resin may be generated by polycondensing a phenol-based compound and an aldehyde-based compound or a ketone-based compound under an acid catalyst. For example, the novolac resin may be a novolac resin synthesized by meta-cresol alone, a novolac resin synthesized by para-cresol alone, a novolac resin including resorcinol, a novolac resin generated by reacting salicylic aldehyde and benzyl aldehyde, or a novolac resin including a mixture of meta-cresol, para-cresol, and resorcinol.

Examples of the phenol-based compound may include phenol, ortho-cresol, meta-cresol, para-cresol, 2,3-dimethylphenol, 3,4-dimethylphenol, 3,5-dimethylphenol, 2,4-dimethylphenol, 2,6-dimethylphenol, 2,3,6-trimethylphenol, 2-t-butylphenol, 3-t-butylphenol, 4-t-butylphenol, 2-methylresorcinol, 4-methylresorcinol, 5-methylresorcinol, 4-t-butylcatechol, 2-methoxyphenol, 3-methoxyphenol, 2-propylphenol, 3-propylphenol, 4-propylphenol, 2-isopropylphenol, 2-methoxy-5-methylphenol, 2-t-butyl-5-methylphenol, thymol, and isothymol. These may be used singly or in combination.

Examples of the aldehyde-based compound may include formaldehyde, formalin, para-formaldehyde, trioxane, acetaldehyde, propylaldehyde, benzoaldehyde, phenylacetaldehyde, α-phenylpropyl aldehyde, β-phenylpropyl aldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-methylbenzaldehyde, m-methylbenzaldehyde, p-methylbenzaldehyde, p-ethylbenzaldehyde, p-n-butylbenzaldehyde, and terephthalic acid aldehyde. These may be used singly or in combination.

Examples of the ketone-based compound may include acetone, methylethylketone, diethylketone, and diphenylketone. These may be used singly or in combination.

Examples of the acid catalyst may include sulfuric acid, hydrochloric acid, formic acid, acetic acid, and oxalic acid.

A weight-average molecular weight of the novolac resin by monodisperse polystyrene conversion, which is measured by gel permeation chromatography (GPC), may be about 3,000 g/mol to about 20,000 g/mol.

A weight ratio of meta-cresol to para-cresol in the novolac resin may be about 4:6 to about 8:2, and two or more of them may be used in combination. In the photoresist composition of the present example embodiment, the content of the novolac resin may be about 5 wt % to about 30 wt % with respect to the entire photoresist composition.

The diazide-based photosensitive compound may be generated by reacting compounds such as polyhydroxy benzophenone, 1,2-naphthoquinonediazide, and 2-diazo-1-naphthol-5-sulfonic acid. Examples of the diazide-based photosensitive compound may include 2,3,4-trihydroxybenzophenone-1,2-naphthoquinonediazide-5-sulfonate generated by esterifying trihydroxybenzophenone and 2-diazo-1-naphthol-5-sulfonic acid; and 2,3,4,4'-tetrahydroxybenzophenone-1,2-naphthoquinonediazide-5-sulfonate generated by esterifying tetrahydroxybenzophenone and 2-diazo-1-naphthol-5-sulfonic acid. These may be used singly or in combination. Also, a combination ratio of the diazide-based compound may be about 0:10 to about 10:0.

In the photoresist composition, the amount of the diazide-based photosensitive compound may be about 2 wt % to about 10 wt % with respect to the entire photoresist composition. When the content of the diazide-based photosensitive compound is less than about 2 wt %, a residual layer ratio may be reduced and an adhesive strength with respect to the substrate may be reduced. When the content of the diazide-based photosensitive compound is greater than about 10 wt %, a photosensing speed may be reduced and a development contrast may be increased.

The solvent may include glycolethers, ethyleneglycol alkyletheracetates, or diethyleneglycols that have high solubility and high reactivity with respect to the respective components and which may provide easy coating layer formation. For example, the solvent may be at least one selected from propyleneglycolmethyletheracetate, ethyl lactate, 2-methoxyethylacetate, propyleneglycolmonomethylether, methylethylketone, methylisobutylketone, and 1-methyl-2-pyrrolidinone.

In the photoresist composition of the present example embodiment, the solvent may be included as a residual portion in the entire photoresist composition, and the content of the solvent may be about 59.9 wt % to about 92.999 wt % with respect to the entire photoresist composition.

The photoresist composition may further include a sensitivity enhancer in order to improve the photoresist sensitivity and the pattern fluidity in a baking process.

Also, the photoresist composition may further include additives such as a coloring agent, a dye, a plasticizer, an adhesion accelerator, a speed enhancer, and a striation inhibitor. Suitable amounts of the additives may be used when the above additives are added to the photoresist composition.

The following Example and Comparative Examples are provided in order to highlight characteristics of one or more embodiments, but it will be understood that the Example and Comparative Examples are not to be construed as limiting the scope of the embodiments, nor are the Comparative Examples to be construed as being outside the scope of the embodiments. Further, it will be understood that the embodiments are not limited to the particular details described in the Example and Comparative Examples.

Photoresist Compositions of Example 1 and Comparative Examples 1 and 2

Example 1

A photoresist composition was manufactured by mixing about 20 g novolac resin having a meta-cresol:para-cresol weight ratio of about 6:4; about 2 g of a photosensitive compound including a mixture of 2,3,4-trihydroxybenzophenone-1,2-naphthoquinonediazide-5-sulfonate and 2,3,4,4'-tetrahydroxybenzophenone-1,2-naphthoquinonediazide-5-sulfonate at a weight ratio of about 5:5; about 50 g of solvent of propyleneglycolmethyletheracetate (PGMEA), and about 0.04 g of a surfactant represented by Chemical Formula 1:

[Chemical Formula 1]

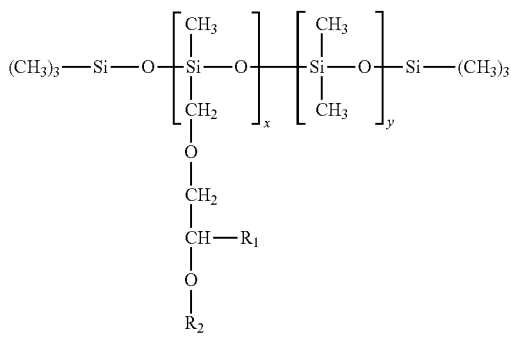

wherein $R_1$ and $R_2$ denote a hydrogen atom or an alkyl group, x is 10-50, and y is 10-50.

Comparative Example 1

A photoresist composition was manufactured by mixing about 20 g of novolac resin having a meta-cresol:para-cresol weight ratio of about 6:4; about 2 g of a photosensitive compound including a mixture of 2,3,4-trihydroxybenzophenone-1,2-naphthoquinonediazide-5-sulfonate and 2,3,4,4'-tetrahydroxybenzophenone-1,2-naphthoquinonediazide-5-sulfonate at a weight ratio of about 5:5; about 50-g of solvent, PGMEA, and about 0.04 g of a surfactant product KP323® manufactured by Shin-Etsu Silicon.

Comparative Example 2

A photoresist composition was manufactured by mixing am about 20 g of novolac resin having a meta-cresol:para-cresol weight ratio of about 6:4; about 2 g of a photosensitive compound including a mixture of 2,3,4-trihydroxybenzophenone-1,2-naphthoquinonediazide-5-sulfonate and 2,3,4,4'-tetrahydroxybenzophenone-1,2-naphthoquinonediazide-5-sulfonate at a weight ratio of about 5:5, about 50 g of solvent, PGMEA; and about 0.04 g of a surfactant product TF1635® manufactured by Dainippon Ink & Chemicals.

Estimation of Thickness Uniformity and Coating Spot

The photoresist compositions for a liquid crystal display apparatus, which were manufactured according to Example 1 and Comparative Examples 1 and 2, were slit-coated on a molybdenum-attached glass substrate of about 400 mm×300 mm and were dried for about 60 seconds under reduced pressure, and the substrate was heated and dried for about 90 seconds at about 110° C., thereby forming a film with a thickness of about 1.50 μm. Thereafter, the coating spot characteristics and the thickness uniformity and the film were measured in the following manner. The measurement results are shown in Table 1.

1. Thickness Uniformity

A maximum thickness and a minimum thickness were measured by measuring the thickness of the photoresist film 300 times (horizontal thickness: 20 times; vertical thickness: 15 times), and the thickness uniformity was calculated according to Equation 1 below.

Thickness Uniformity (%)=(Maximum Thickness−Minimum Thickness)/(Maximum Thickness+Minimum Thickness) [Equation 1]

2. Coating Spot Characteristics

Figure 12:
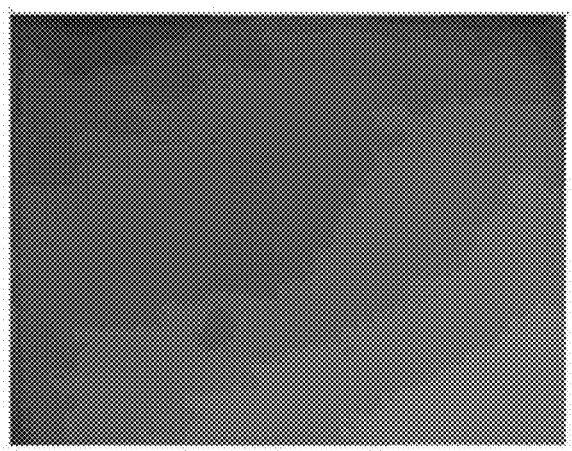
FIG. 12 illustrates a diagram illustrating coating spot characteristics of photoresist layers according to Example 1, Comparative Example 1, and Comparative Example 2.
Figure 12:
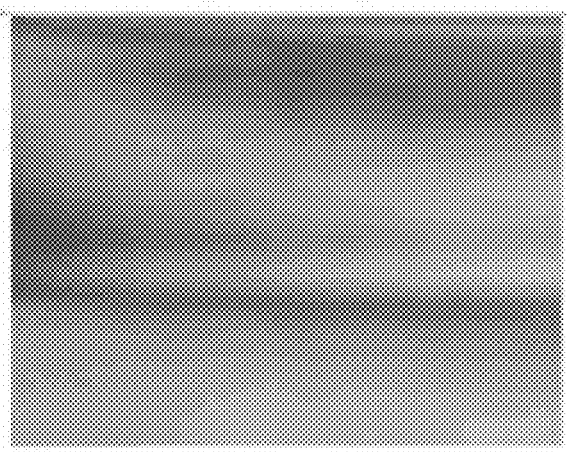
Figure 12:
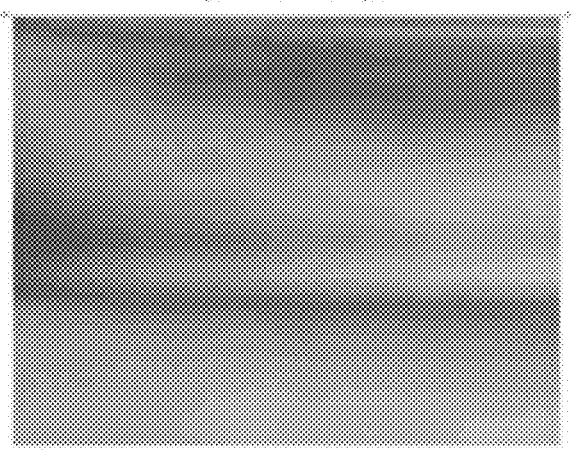

The surface of the photoresist film was observed with the naked eye under a surface-observation halogen lamp, and a degree of a horizontal stripe was estimated. The results of the coating spot characteristics evaluation are illustrated in FIG. 12.

TABLE 1

| Classification | Example 1 | Comparative Example 1 | Comparative Example 2 |
|---|---|---|---|
| Coating Uniformity (%) | 0.86 | 1.68 | 1.13 |
| Spot Characteristics | ◯ | Δ | X |

In Table 1, "◯" indicates that spots were not observed, "Δ" indicates that some spots were observed, and "X" indicates that significant spotting was observed.

As may be seen from the results in Table 1, in comparison with Comparative Examples 1 and 2, Example 1 provided higher coating uniformity and did not exhibit any spots.

As described above, according to the one or more of the above example embodiments, the photoresist composition may be easily removed by the stripper. Thus, a foreign substance defect caused by a residual photoresist solution on the electrode pattern may be reduced or prevented, and the reliability of the TFT substrate may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A photoresist composition, comprising:
a solvent;
a novolac resin;
a diazide-based photosensitive compound; and
a surfactant represented by Chemical Formula 1:

[Chemical Formula 1]

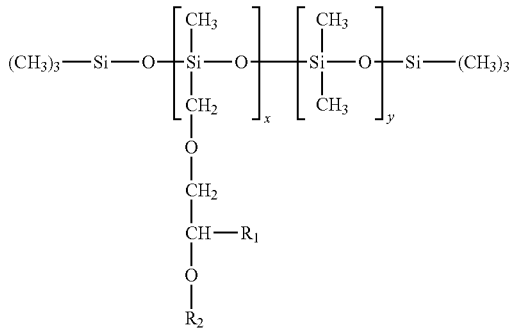

wherein $R_1$ and $R_2$ denote a hydrogen atom or an alkyl group, x is 10-50, and y is 10-50.

2. The photoresist composition as claimed in claim 1, including:
   about 5 wt % to about 30 wt % of the novolac resin;
   about 2 wt % to about 10 wt % of the diazide-based photosensitive compound;
   about 0.001 wt % to about 0.1 wt % of the surfactant; and
   a residual amount of the solvent.

3. The photoresist composition as claimed in claim 1, wherein:
   the novolac resin includes meta-cresol and para-cresol,
   a weight ratio of the meta-cresol to the para-cresol is about 4:6 to about 8:2, and
   a weight average molecular weight of the novolac resin is about 3,000 g/mol to about 20,000 g/mol.

4. The photoresist composition as claimed in claim 1, wherein the diazide-based photosensitive compound includes at least one of 2,3,4-trihydroxybenzophenone-1,2-naphthoquinonediazide-5-sulfonate and 2,3,4,4'-tetrahydroxybenzophenone-1,2-naphthoquinonediazide-5-sulfonate.

5. The photoresist composition as claimed in claim 1, wherein the solvent includes at least one solvent selected from propyleneglycolmethyletheracetate, ethyl lactate, 2-methoxyethylacetate, propyleneglycolmonomethylether, methylethylketone, methylisobutylketone, and 1-methyl-2-pyrrolidinone.

6. The photoresist composition as claimed in claim 1, wherein the surfactant is hydrophilic.

7. The photoresist composition as claimed in claim 1, wherein the photoresist composition is a positive photoresist composition.

8. The photoresist composition as claimed in claim 1, wherein the photoresist composition further comprises at least one additive selected from a coloring agent, a dye, a plasticizer, an adhesion accelerator, a speed enhancer, and a striation inhibitor.

9. A method of manufacturing a thin film transistor (TFT) substrate, the method comprising:
   forming a conductive layer of conductive material on a substrate;
   forming an etching pattern on the conductive layer using the photoresist composition as claimed in claim 1; and
   forming a conductive layer pattern by etching the conductive layer using the etching pattern as an etching mask.

10. The method as claimed in claim 9, wherein the conductive layer pattern is a pixel electrode pattern including a transparent conductive material.

11. The method as claimed in claim 10, wherein the pixel electrode pattern includes a plurality of microelectrodes and a plurality of microslits between the plurality of microelectrodes.

12. The method as claimed in claim 9, wherein the conductive layer pattern is a gate line or a data line.

13. The method as claimed in claim 9, wherein the photoresist composition includes:
   about 5 wt % to about 30 wt % of the novolac resin;
   about 2 wt % to about 10 wt % of the diazide-based photosensitive compound;
   about 0.001 wt % to about 0.1 wt % of the surfactant; and
   a residual amount of the solvent.

14. The method as claimed in claim 9, wherein:
   the novolac resin includes meta-cresol and para-cresol,
   a weight ratio of the meta-cresol to the para-cresol is about 4:6 to about 8:2, and
   a weight average molecular weight of the novolac resin is about 3,000 g/mol to about 20,000 g/mol.

15. The method as claimed in claim 9, wherein the diazide-based photosensitive compound includes at least one selected from 2,3,4-trihydroxybenzophenone-1,2-naphthoquinonediazide-5-sulfonate and 2,3,4,4'-tetrahydroxybenzophenone-1,2-naphthoquinonediazide-5-sulfonate.

16. The method as claimed in claim 9, wherein the solvent includes at least one selected from propyleneglycolmethyletheracetate, ethyl lactate, 2-methoxyethylacetate, propyleneglycolmonomethylether, methylethylketone, methylisobutylketone, and 1-methyl-2-pyrrolidinone.

17. The method as claimed in claim 9, wherein the surfactant is hydrophilic.

18. The method as claimed in claim 9, wherein the photoresist composition is a positive photoresist composition.

19. The method as claimed in claim 9, further comprising removing the etching pattern with a stripper.

20. The method as claimed in claim 9, wherein the photoresist composition further comprises at least one additive selected from a coloring agent, a dye, a plasticizer, an adhesion accelerator, a speed enhancer, and a striation inhibitor.

* * * * *